(12) United States Patent
Chow et al.

(10) Patent No.: US 8,358,155 B2
(45) Date of Patent: Jan. 22, 2013

(54) CIRCUIT THAT FACILITATES PROXIMITY COMMUNICATION

(75) Inventors: Alex Chow, East Palo Alto, CA (US);
Robert J. Drost, Los Altos, CA (US);
Ronald Ho, Mountain View, CA (US);
Robert Proebsting, Sonora, CA (US);
Arlene Proebsting, legal representative, Sonora, CA (US)

(73) Assignee: Oracle America, Inc., Redwood Shores, CA (US)

( * ) Notice: Subject to any disclaimer, the term of this patent is extended or adjusted under 35 U.S.C. 154(b) by 1241 days.

(21) Appl. No.: 12/215,943

(22) Filed: Jun. 30, 2008

(65) Prior Publication Data

US 2009/0189674 A1 Jul. 30, 2009

Related U.S. Application Data

(60) Provisional application No. 61/024,472, filed on Jan. 29, 2008.

(51) Int. Cl.
*H03K 19/20* (2006.01)
(52) U.S. Cl. ....................................................... 326/113
(58) Field of Classification Search .................. 326/113, 326/82–87
See application file for complete search history.

(56) References Cited

U.S. PATENT DOCUMENTS

| | | | | |
|---|---|---|---|---|
| 4,401,904 A | * | 8/1983 | White et al. | 327/288 |
| 7,928,794 B2 | * | 4/2011 | Balboni | 327/427 |
| 2004/0150009 A1 | * | 8/2004 | Marshall et al. | 257/207 |

* cited by examiner

*Primary Examiner* — Thienvu Tran
(74) *Attorney, Agent, or Firm* — Park, Vaughan, Fleming & Dowler LLP; Mark D. Spiller

(57) ABSTRACT

One embodiment of the present invention provides a system that facilitates proximity communication. This system includes a circuit containing a bootstrap transistor and a pass-gate transistor, where the drain of the bootstrap transistor is coupled to the gate of the pass-gate transistor. Note that a first coupling capacitance exists between the source of the pass-gate transistor and the drain of the bootstrap transistor and a second coupling capacitance exists between the drain of the pass-gate transistor and the drain of the bootstrap transistor. During operation, the gate and the source of the bootstrap transistor are coupled to a high voltage, thereby causing an intermediate voltage at the drain of the bootstrap transistor. When the source of the pass-gate transistor transitions to a high voltage, the first coupling capacitance and the second coupling capacitance boost the voltage at the gate of the pass-gate transistor higher than the high voltage, thereby enabling the high voltage at the source of the pass-gate transistor to pass to the drain of the pass-gate transistor.

20 Claims, 18 Drawing Sheets
(13 of 18 Drawing Sheet(s) Filed in Color)

----- MACROPAD CELL BOUNDARY

◯— FIRST-LEVEL (VERTICAL) MUX
◗— SECOND-LEVEL (HORIZONTAL) MUX
━— DATA FROM SELF ("ME")
━— DATA FROM WEST NEIGHBOR ("fromW")
━— DATA FROM EAST NEIGHBOR ("fromE")

|  | COLUMN 1 | COLUMN 2 | COLUMN 3 | COLUMN 4 |
|---|---|---|---|---|
| ROW 1 | N: 48%<br>S: 12%<br>W: 40% | N: 64%<br>S: 16%<br>W: 20% | N: 64%<br>S: 16%<br>E: 20% | N: 48%<br>S: 12%<br>E: 40% |
| ROW 2 | N: 36%<br>S: 24%<br>W: 40% | N: 48%<br>S: 32%<br>W: 20% | N: 48%<br>S: 32%<br>E: 20% | N: 36%<br>S: 24%<br>E: 40% |
| ROW 3 | N: 24%<br>S: 36%<br>W: 40% | N: 32%<br>S: 48%<br>W: 20% | N: 32%<br>S: 48%<br>E: 20% | N: 24%<br>S: 36%<br>E: 40% |
| ROW 4 | N: 12%<br>S: 48%<br>W: 20% | N: 16%<br>S: 64%<br>W: 20% | N: 16%<br>S: 64%<br>E: 20% | N: 12%<br>S: 48%<br>E: 40% |

FIG. 10A

|  | COLUMN 1 | COLUMN 2 | COLUMN 3 | COLUMN 4 |
|---|---|---|---|---|
| ROW 1 | N: 50%<br>S: 0%<br>W: 50% | N: 75%<br>S: 0%<br>W: 25% | N: 100%<br>S: 0%<br>E: 0% | N: 75%<br>S: 0%<br>E: 25% |
| ROW 2 | N: 37.5%<br>S: 12.5%<br>W: 50% | N: 56.25%<br>S: 18.75%<br>W: 25% | N: 75%<br>S: 25%<br>E: 0% | N: 56.25%<br>S: 18.75%<br>E: 25% |
| ROW 3 | N: 25%<br>S: 25%<br>W: 50% | N: 37.5%<br>S: 37.5%<br>W: 25% | N: 50%<br>S: 50%<br>E: 0% | N: 37.5%<br>S: 37.5%<br>E: 25% |
| ROW 4 | N: 12.5%<br>S: 37.5%<br>W: 50% | N: 18.75%<br>S: 56.25%<br>W: 25% | N: 25%<br>S: 75%<br>E: 0% | N: 18.75%<br>S: 56.25%<br>E: 25% |

FIG. 10B

····— MACROPAD CELL BOUNDARY

CIRCUIT THAT FACILITATES PROXIMITY COMMUNICATION

RELATED APPLICATION

This application claims priority under 35 U.S.C. §119(e) to U.S. Provisional Application No. 61/024,472, entitled "Power Optimized Techniques for Electronic Alignment Correction," by inventors Alex Chow, Robert J. Drost, and Ronald Ho, filed on 29 Jan. 2008, the contents of which are herein incorporated by reference.

GOVERNMENT LICENSE RIGHTS

This invention was made with United States Government support under Contract No. NBCH3039002 awarded by the Defense Advanced Research Projects Administration. The United States Government has certain rights in the invention.

COLOR DRAWINGS

The patent or application file contains at least one drawing executed in color. Copies of this patent or patent application publication with color drawing(s) will be provided by the Office upon request and payment of the necessary fee.

BACKGROUND

1. Field of the Invention

The present invention generally relates to semiconductor integrated circuits. More specifically, the present invention relates to techniques that facilitate proximity communication.

2. Related Art

Proximity communication techniques have been developed to facilitate communications between semiconductor chips. One promising proximity communication technique involves integrating arrays of capacitive transmitters and receivers onto semiconductor chips to facilitate inter-chip communication. For instance, a first chip can be situated face-to-face with a second chip so that transmitter pads on the first chip are capacitively coupled with receiver pads on the second chip, thereby allowing the first chip to transmit data signals directly to the second chip without having to route the data signals through intervening signal lines within a printed circuit board. Such capacitive communication techniques can greatly increase the communication bandwidth between chips, but they depend upon precise alignment between the associated communications components. For example, the effectiveness of capacitive coupling often depends on the alignment of the transmitter pads and the receiver pads.

Because sub-optimal alignment can reduce inter-chip communication performance and increase power consumption, some proximity communication systems employ electronic alignment techniques that dynamically correct the alignment of components to compensate for mechanical misalignment. For instance, each transmit pad may be split into an array of micropads that is supported by circuitry that can steer data to a subset of micropads that optimally overlaps with a receiving pad. Unfortunately, providing such circuitry to steer data is costly and consumes additional power.

Hence, what is needed are structures and methods that allow high-bandwidth communication between chips without the above-described problems.

SUMMARY

One embodiment of the present invention provides a system that facilitates proximity communication. This system includes a circuit containing a bootstrap transistor and a pass-gate transistor, where the drain of the bootstrap transistor is coupled to the gate of the pass-gate transistor. Note that a first coupling capacitance exists between the source of the pass-gate transistor and the drain of the bootstrap transistor and a second coupling capacitance exists between the drain of the pass-gate transistor and the drain of the bootstrap transistor. During operation, the gate and the source of the bootstrap transistor are coupled to a high voltage, thereby causing an intermediate voltage at the drain of the bootstrap transistor. When the source of the pass-gate transistor transitions to a high voltage, the first coupling capacitance and the second coupling capacitance boost the voltage at the gate of the pass-gate transistor higher than the high voltage, thereby enabling the high voltage at the source of the pass-gate transistor to pass to the drain of the pass-gate transistor.

In some embodiments, the bootstrap transistor and the pass-gate transistor are NMOS transistors.

In some embodiments, the source of the bootstrap transistor is a select signal for the circuit. For instance, when the source of the bootstrap transistor is coupled to a high voltage, the circuit passes a high voltage at the source of the pass-gate transistor to the drain of the pass-gate transistor. Similarly, when the source of the bootstrap transistor is coupled to a high voltage, a low voltage at the source of the pass-gate transistor causes a low voltage at the drain of the pass-gate transistor.

In some embodiments, the system uses the circuit as a pass-gate that facilitates electronic alignment correction by passing both high and low voltage input signals while using less power and/or area.

In some embodiments, the system facilitates increasing the voltage swing across the pass-gate transistor for a given amount of power. For instance, the circuit may pass the high voltage to a transmission pad in a communication circuit that sends a signal to a receiving circuit using proximity communication, thereby improving the signal detected by the receiving circuit.

In some embodiments, the bootstrap transistor and the pass-gate transistor are fabricated to provide a desired voltage boost for the gate of the pass-gate transistor.

In some embodiments, fabricating the bootstrap transistor and the pass-gate transistor involves one or more of the following: sizing the bootstrap transistor and the pass-gate transistor to provide the desired voltage boost; and/or adjusting characteristics for the pass-gate transistor to produce capacitances for the first coupling capacitance and the second capacitance that enable boosting the voltage at the gate of the pass-gate transistor higher than the high voltage.

In some embodiments, the bootstrap transistor facilitates boosting the voltage for the gate of the pass-gate transistor above the high voltage, thereby enabling passing the high voltage across the pass-gate transistor without requiring a second, separate voltage supply that generates a voltage that is higher than the normal high voltage used by the system.

In some embodiments, the intermediate voltage at the drain of the bootstrap transistor reduces the parasitic capacitance seen at the source of the pass-gate transistor, thereby allowing smaller signal drivers to be used at the input (source) of the pass-gate transistor and enhancing power savings.

BRIEF DESCRIPTION OF THE FIGURES

FIG. 10A illustrates the computed routing probabilities for the 4×4 micropad array structure illustrated in FIG. 2E in accordance with an embodiment of the present invention.

FIG. 10B illustrates the computed routing probabilities for the more power-optimal micropad array illustrated in FIG. 4A in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Electronic Alignment Correction for Proximity Communication

Proximity communication typically requires precise alignment of two communicating components (e.g., two semiconductor chips) in order to ensure that the transmitting and receiving pads provide adequate signal coupling. Electronic alignment correction relaxes the need for tight mechanical alignment and mitigates misalignment of chips during operation due to vibrations and thermal expansion. For instance, a transmit region may be composed of a number of micropads which can be dynamically grouped together to send a uniform signal to a complementary receiving pad. A proximity communication system may include measurement sensors that determine the placement and alignment of two communicating components, and then ensure that data signals are steered correctly from transmit pads to receiving pads.

Figure 1A:
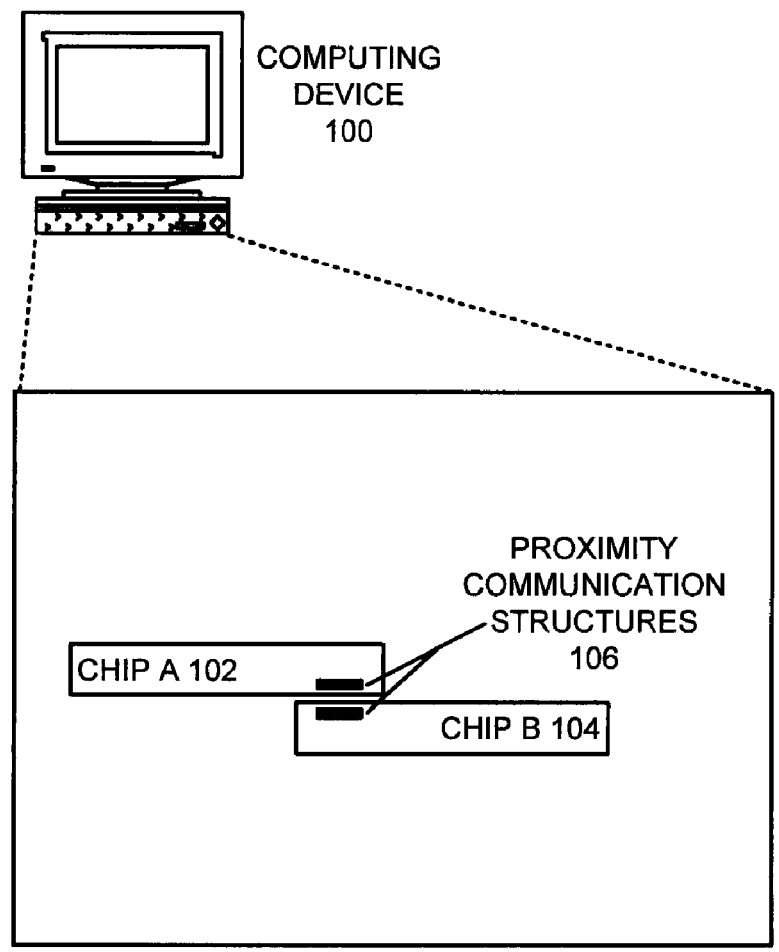
FIG. 1A illustrates two exemplary semiconductor chips that communicate using a set of proximity communication structures in accordance with an embodiment of the present invention.

FIG. 1A illustrates two exemplary semiconductor chips in a computing device 100, chip A 102 and chip B 104, that communicate using a set of proximity communication structures 106. Note that chip A 102 and chip B 104 might not be physically connected in any way, and may communicate purely using the proximity communication (e.g., capacitive coupling, or other proximity communication techniques). Note also that proximity communication is not limited to the arrangement illustrated in FIG. 1A, but may include a range of other proximity communication configurations and/or components, including, but not limited to, different locations for proximity communication structures, different alignments, bridge structures, and/or flexible wire structures.

Figure 1B:
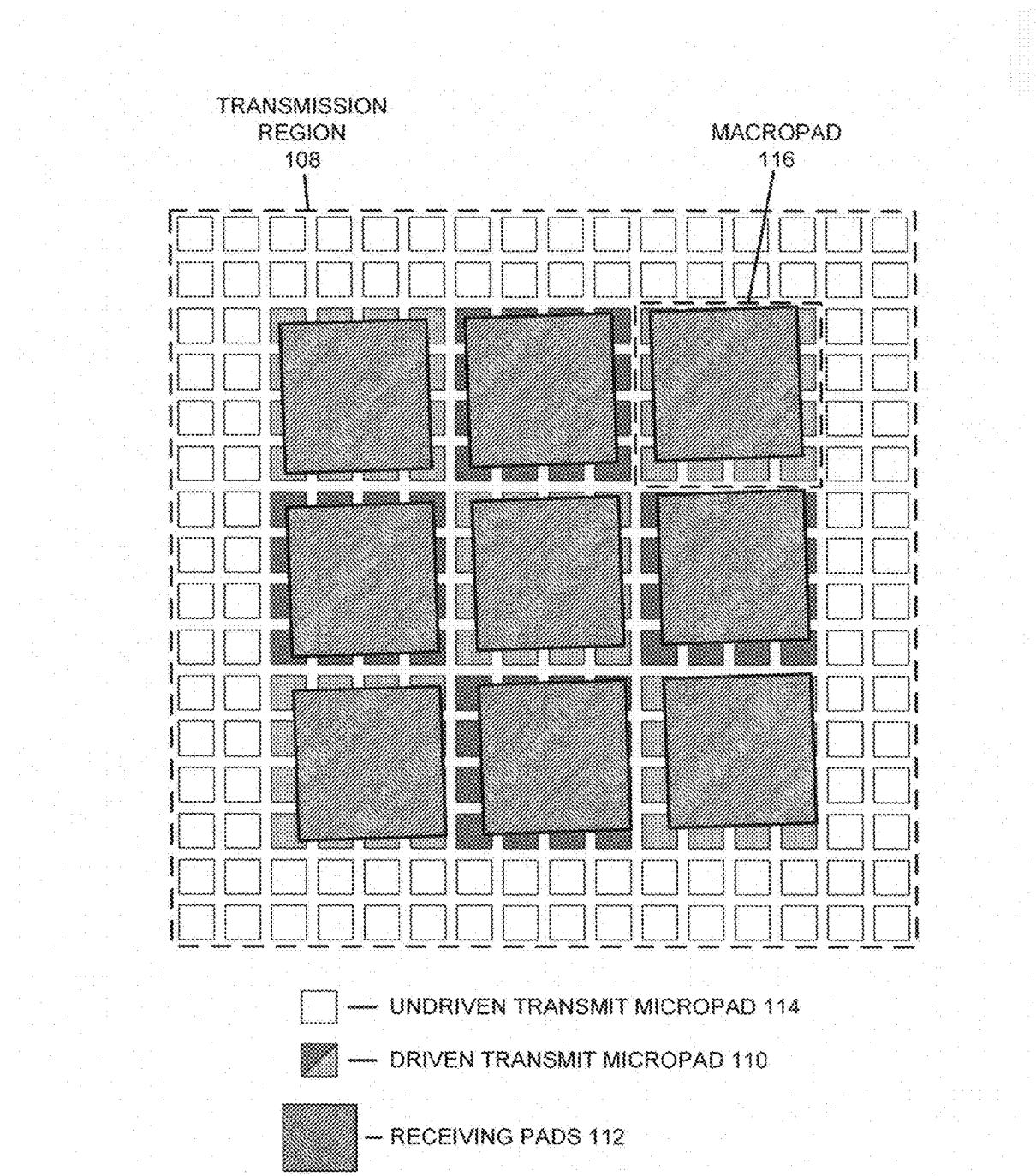
FIG. 1B illustrates an array of micropads that have been dynamically grouped to transmit signals to a complementary set of receiving pads in accordance with an embodiment of the present invention.

FIG. 1B illustrates an array of micropads that have been dynamically grouped to transmit signals to a complementary set of receiving pads. In FIG. 1B, transmission region 108 is electronically configured to drive a set of transmit micropads 110 that correspond most closely to the layout and location of receiving pads 112. Transmit micropads that are not in proximity to receiving pads 112 are undriven 114, but may be used subsequently if conditions cause the location of receiving pads 112 to move with respect to the transmission region 108. Note that micropads can be grouped together to form logical transmit "macropads" (in this example, 4×4 groups of micropads, as indicated by the groups of green and yellow micropads that correspond to the size and spacing of receiving pads 112), such as macropad 116, each of which transmits the same signal to one receiving pad on the receiving chip. A switching fabric in transmission region 108 steers data to micropads that provide optimal overlap for each given receiving pad. The dynamic capabilities of the transmit micropads and switching fabric can be used to compensate for mechanical misalignment of the chips, and can thereby facilitate dynamic alignment correction.

Figure 2A:
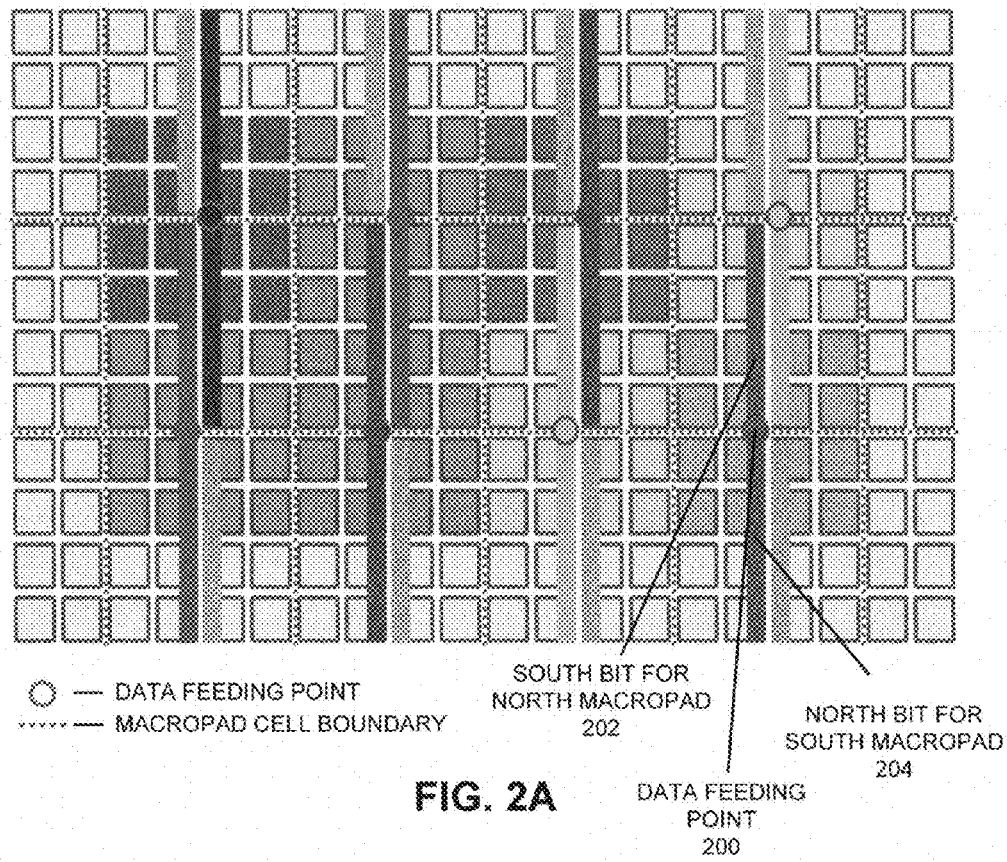
FIG. 2A illustrates the vertical distribution of data in an exemplary switching fabric in accordance with an embodiment of the present invention.

FIGS. 2A-2E illustrate an exemplary implementation of switching fabric that facilitates electronic alignment correction. In FIGS. 2A-2E, the data steering logic employs two stages. Each data bit is first distributed across two macropad pitches, as shown in FIG. 2A, where the dotted lines show the macropad cell boundaries. Note that these physical macropads are different from the logical macropads described above, which are groupings of micropads that transmit the same signal to a given receiving pad. In contrast, a physical macropad (referred to simply as a macropad in the following description) is a physical group of micropads and supporting circuitry that is repeated through the steering fabric to support electronic alignment correction.

Figure 2B:
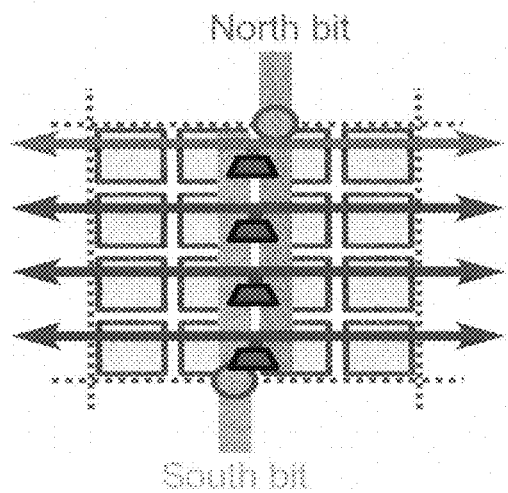
FIG. 2B illustrates the multiplexing of a vertical data signal across the rows of the exemplary switching fabric of FIG. 2A in accordance with an embodiment of the present invention.

A given macropad receives two vertical data bits, from the north and south sides of the cell (as shown in FIG. 2B), and can determine on a row-by-row basis whether a given row will receive a data signal from the north or south bit. For example, in FIG. 2A, a data bit fed into data feeding point 200 can be routed to eight rows of micropads (as indicated by the blue vertical bit line above and below data feeding point 200), with the vertical bit lines overlapping such that each given vertical data signal is fed to two macropads. In FIG. 2A, data feeding point 200 feeds the south bit for the macropad that is located north 202 of data feeding point 200, and feeds the north bit for the macropad south 204 of data feeding point 200.

Figure 2C:
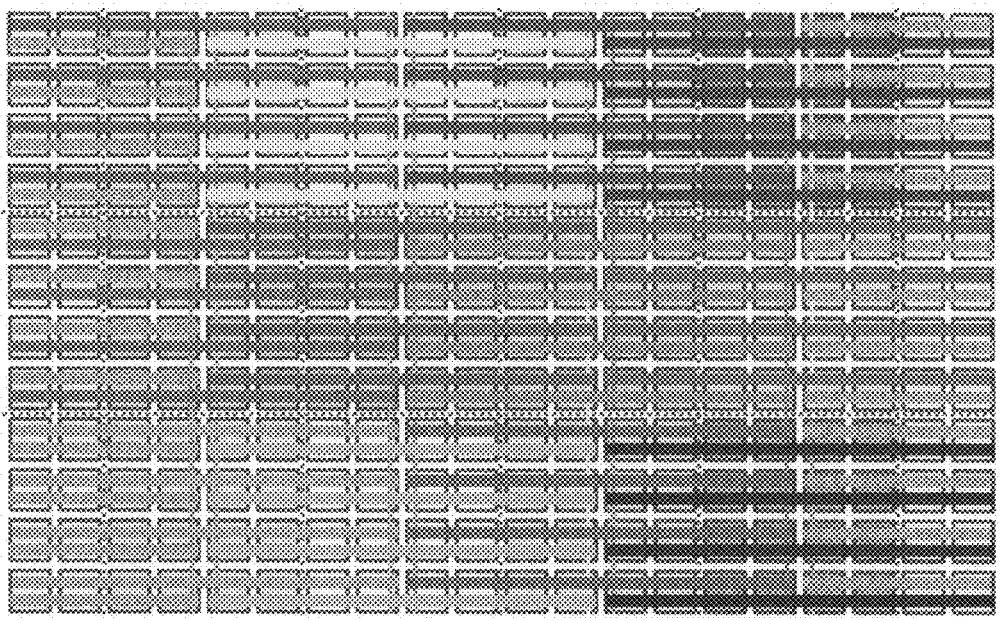
FIG. 2C illustrates the horizontal distribution of data in the exemplary switching fabric of FIGS. 2A-2B in accordance with an embodiment of the present invention.
Figure 2D:
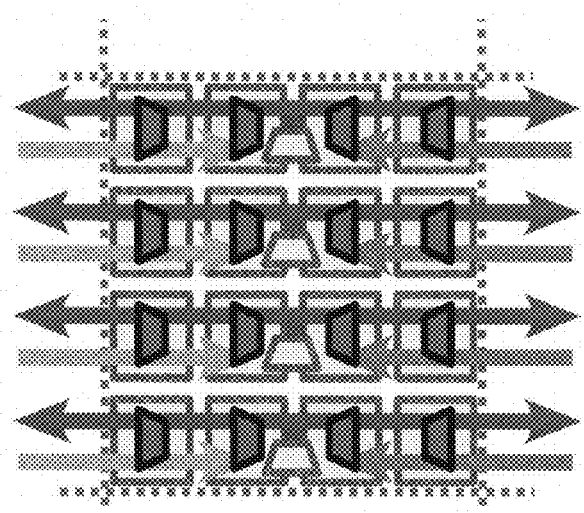
FIG. 2D illustrates the multiplexing of a horizontal data signal across the micropads of the exemplary switching fabric of FIGS. 2A-2C in accordance with an embodiment of the present invention.

In the second stage, vertical bits are distributed across the rows of the switching fabric. For each row, a data signal received from a vertical bit line in the center of the macropad is then driven onto a horizontal wire that spans a total width of two macropads, thereby covering both the originating macropad (referred to as "me") as well as half of a macropad pitch into the neighboring macropads to the east and west. For instance, for a switching fabric with macropads that are four micropads wide and high (as shown in FIGS. 2A-2E), the horizontal extent of a horizontal wire spans eight micropads (as shown in FIG. 2C), with the left half of each macropad row receiving a bit from a west neighbor (referred to as "fromW"), and the right half of each macropad row receiving a bit from an east neighbor (referred to as "fromE") (as shown in FIG. 2D). Hence, after a first level of multiplexing selects either the north or south bit for a given row (as shown in FIG. 2B), a second level of multiplexing enables selecting whether to drive each micropad either from the macropad's vertical feed ("me") or from a horizontal neighboring cell's vertical feed (either "fromE" or "fromW," depending on the location of the micropad in the macropad), as shown in FIG. 2D.

Figure 2E:
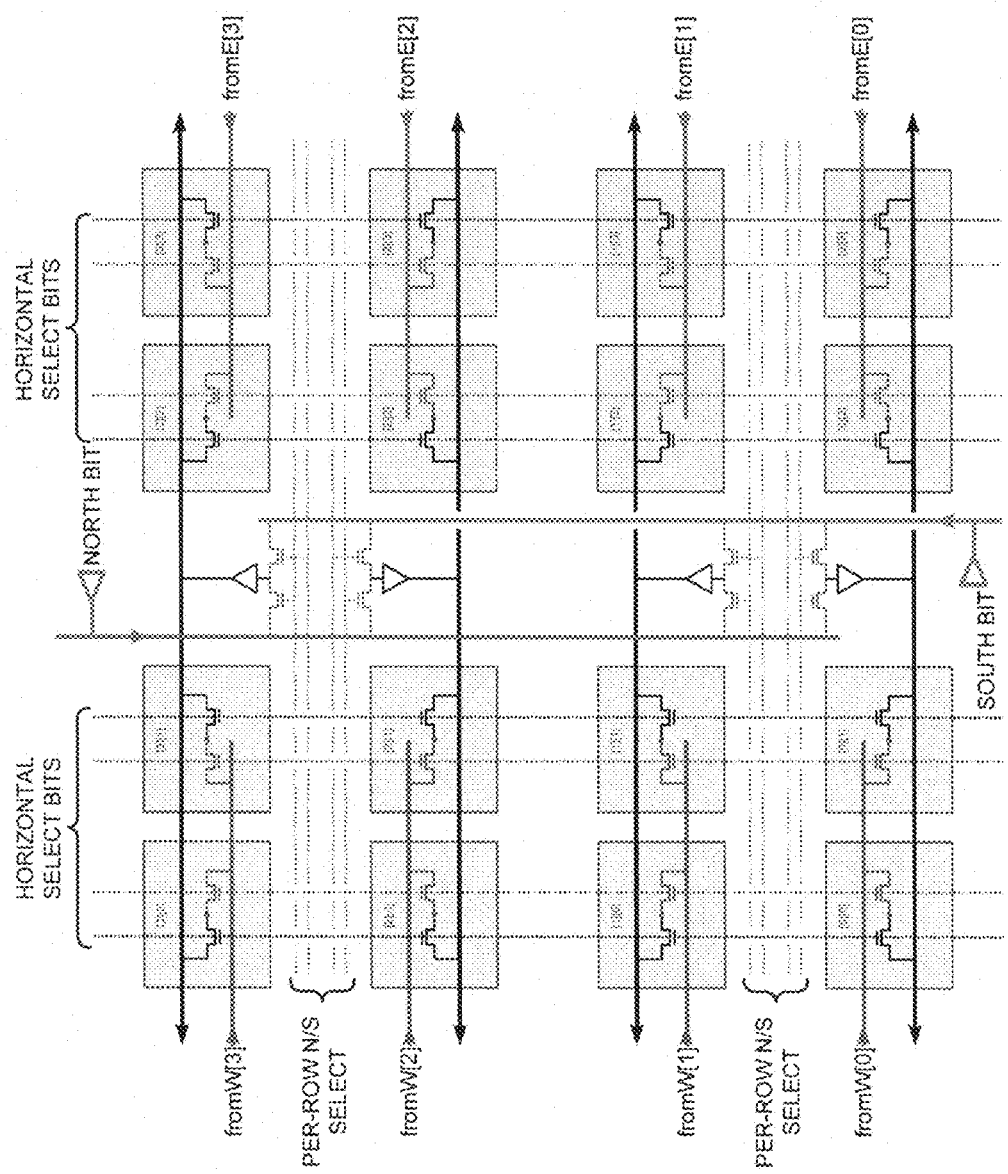
FIG. 2E illustrates exemplary electronic alignment circuitry that implements the steering capabilities illustrated in FIGS. 2A-2D for the exemplary switching fabric in accordance with an embodiment of the present invention.

FIG. 2E illustrates exemplary electronic alignment circuitry that implements the steering capabilities illustrated in FIGS. 2A-2D for a 4×4 micropad partitioning of one transmission macropad cell. FIG. 2E illustrates both of the above-described levels of multiplexing, where each pair of transistors illustrated in FIG. 2E is a representation of a two-to-one multiplexer, and some additional circuitry is not shown. Note that the circuitry illustrated in FIG. 2E is repeated throughout the switching fabric (using different data and signal lines, of course). Note also that receiving pads are not constrained to be the size of 4×4 micropads (as illustrated in FIG. 1B), but may also be either larger or smaller than the pitch of macropads in the steering fabric.

Note that while the switching fabric illustrated in FIGS. 2A-2E facilitates flexibly adjusting sets of transmit micropads used to transmit data to match the location and orientation of (misaligned) receiving pads, the switching fabric that steers data in the transmit array (e.g., a large number of multiplexers, data lines, and signal lines) consumes considerable area and power.

For instance, the cost in gates and power for a transmit macropad with N×N micropads scales with $N^2$. Even for a coarsely partitioned 4×4 array (where N=4), the cost in transmit power is about nine to twelve times the power that is needed to drive signals without electronic alignment correction, with substantially similar speed performance. Hence, techniques that reduce the power consumed by electronic alignment correction are important for enabling proximity communication in modern integrated circuit designs.

Some embodiments of the present invention reduce the power consumed by transmitter steering circuitry needed for electronic alignment correction by:

hard-wiring columns and/or rows of micropads in the steering fabric;

using thick-oxide NMOS transistor pass-gates in the steering fabric;

using bootstrapped NMOS transistor pass-gates in the steering fabric;

using floating fill-metal to reduce parasitic pad capacitance;

routing signals over areas with probabilistically favorable coupling; and/or using a checkerboard micropad array.

These techniques are described in the following sections.

Hard-Wiring Micropads in the Steering Fabric

In the exemplary steering fabric illustrated in FIG. 2E, every micropad can be switched to one of four data values (e.g., the north and south data bits from the micropad's own macropad cell, or the north and south data bits from one of the horizontal neighboring macrocell neighbors, fromE and fromW). This organization allows (N+1) possible steering configurations in each dimension (e.g., one to four micropads on, or all micropads off), for a total of $(N+1)^2$ positions.

Figure 3:
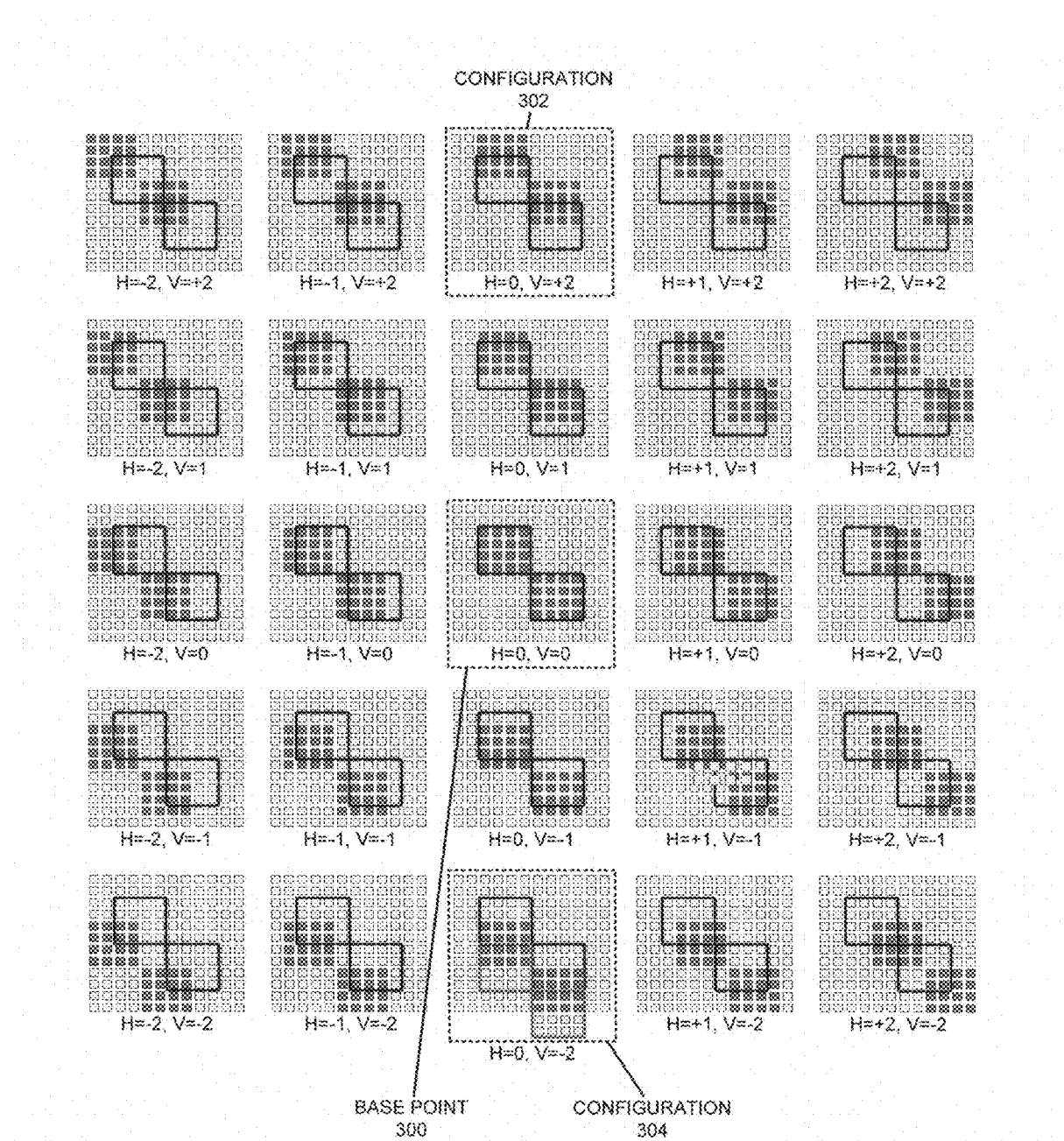
FIG. 3 illustrates the set of possible steering configurations for an exemplary 4×4 grouping of transmit micropads in accordance with an embodiment of the present invention.

FIG. 3 illustrates the set of possible steering configurations for a 4×4 grouping (N=4) of transmit micropads. More specifically, FIG. 3 shows the steering offset from the context of a base point 300 where two receiving pads are exactly aligned with transmit macropads in the steering fabric. The illustrated range of steering configurations spans a range of two full macropads, going ±2 micropads in each dimension from base point 300 in increments of one micropad, where the labels H and V denote the degree of shifting away from base point 300. Hence, FIG. 3 illustrates 25 steering configurations that cover a total of two macropad pitches in either dimension.

Note that, while the previously described steering fabric circuitry (illustrated in FIG. 2E) supports the full range of illustrated steering configurations, certain configurations are redundant. For instance, the set of signals for the activated micropads in configuration 302 where H=0 and V=+2, from the context of the two macropads highlighted in black, have the same logical configuration as the set of signals for the activated micropads in configuration 304 where H=0 and V=−2, from the context of the two macropads located south of the two macropads highlighted in black (which are shown highlighted in red in configuration 304). E.g., the local settings for the activated micropads illustrated in configuration 302 are substantially the same as the local settings for the activated micropads in configuration 304 when the macro signals used in configuration 302 are logically shifted south by one macropad (for configuration 304). Specifically, the second configuration can be achieved by permuting the data bits at a higher level, thereby allowing some circuitry that supports this configuration from the context of the black bordered macropads to be removed. Generally, all of the H=+2 configurations (the right column of configurations in FIG. 3) are logically identical to the corresponding H=−2 configurations (the left column of configurations in FIG. 3), and all of the V=+2 configurations are logically identical to the corresponding V=−2 configurations (in the context of neighboring macropads). Hence, 9 of the 25 illustrated configurations do not need to be supported by a given macropad in a steering fabric with 4×4 macropads.

In one embodiment of the present invention, redundant steering configurations are avoided by hard-wiring one column and one row of micropads in each macropad. This organization greatly simplifies the steering logic, thereby providing a substantial savings in transmit power, while still allowing the data signals transmitted by the micropads to be electronically aligned to match the full range of receiving pad locations. For instance, the vertical line feeding a top row of micropads can be hard-wired to the north bit, and the first column in the right half of the macropad can be hard-wired to the selected vertical ("me") bit for each given row (e.g., eliminating the "fromE" option for that column). Hard-wiring micropads allows unnecessary first- and second-level multiplexers to be eliminated from the switching fabric. For instance, for an N×N pad partitioning, this technique eliminates one first-level multiplexer and N second-level multiplexers. Eliminating multiplexers effectively reduces the loading along signal paths, thereby allowing smaller drivers to be used and reducing the needed transmit power. Note that the fractional savings in power are larger for smaller values of N.

Figure 4A:
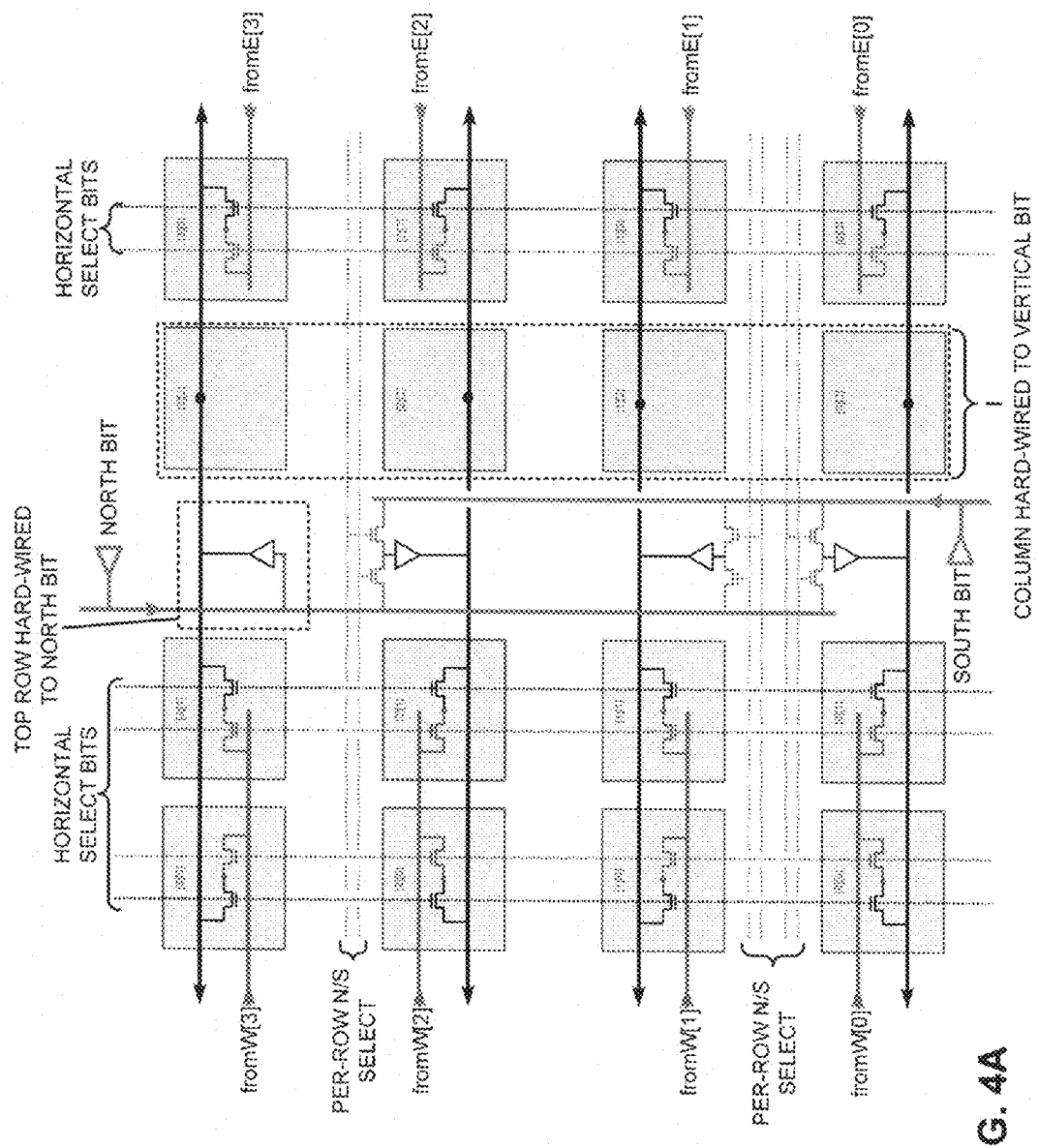
FIG. 4A illustrates exemplary steering circuitry for a 4×4 macropad in which the top row of micropads and the first column of micropads in the right half of the macropad are hard-wired to the selected vertical bit of each row in accordance with an embodiment of the present invention.
Figure 4B:
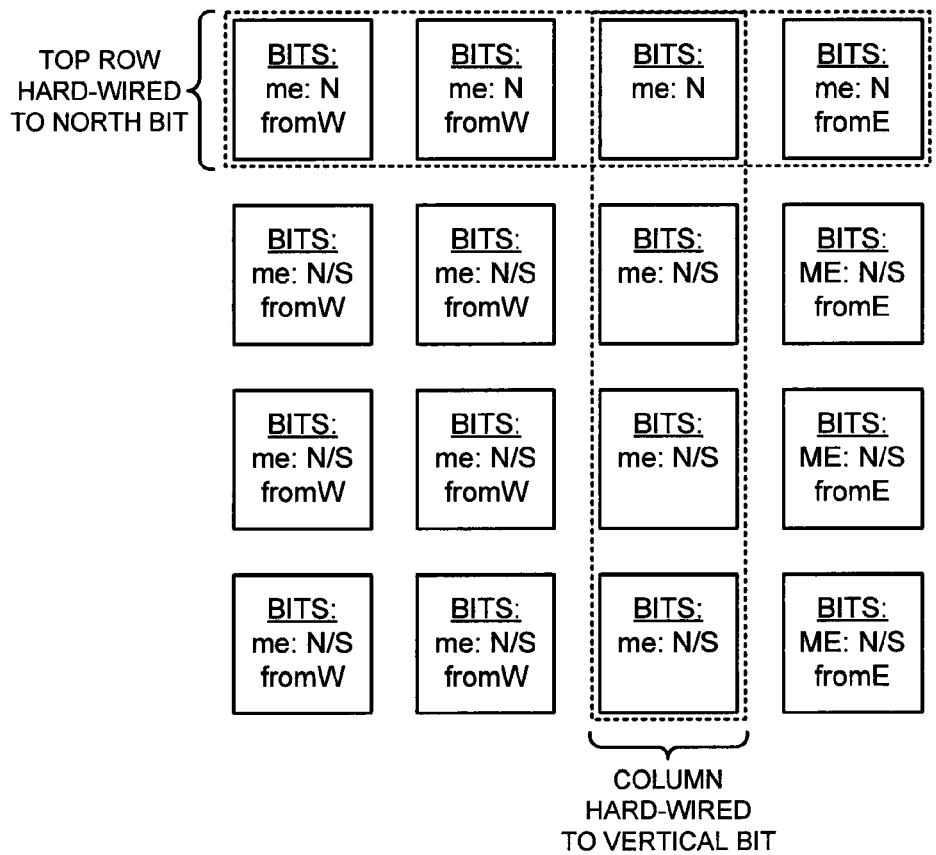
FIG. 4B illustrates a simplified view of the micropads of FIG. 4A that indicates the set of bits which can be selected for each of the micropads in accordance with an embodiment of the present invention.

FIG. 4A illustrates exemplary steering circuitry for a 4×4 macropad in which the top row of micropads are hard-wired to the north bit and the first column of micropads in the right half of the macropad is hard-wired to the selected vertical ("me"—e.g., N or S) bit of each row. FIG. 4B illustrates a simplified view of the micropads of FIG. 4A that indicates the set of bits which can be selected for each of the micropads.

For the case where N=4, the described technique eliminates one first-level multiplexer and four second-level multiplexers. For micropads sized 7×7 μm spaced 2 μm apart, the power used is reduced between 8.2 and 11.5% when the drivers are resized for substantially similar speed performance, depending on wire lengths and the physical dimensions of the transmission pad array.

Reducing Multiplexer Power Consumption Using Thick-Oxide Transistors

The above-described steering fabric incorporates a large number of multiplexers. Reducing the power consumption and area of such multiplexers can significantly reduce the amount of power used for electronic alignment correction, thereby enhancing the feasibility of efficient, lower-power proximity communication.

Figure 5A:
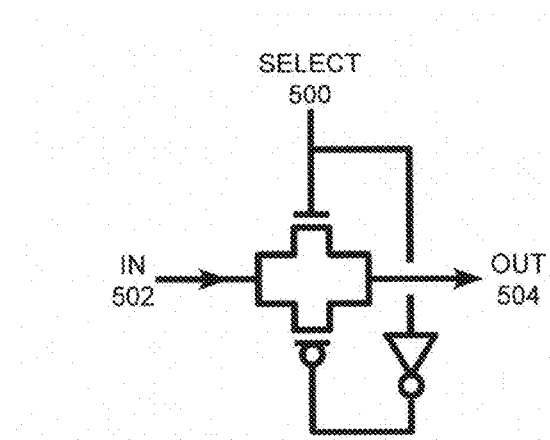
FIG. 5A illustrates a complementary pass-gate circuit in accordance with an embodiment of the present invention.
Figure 5B:
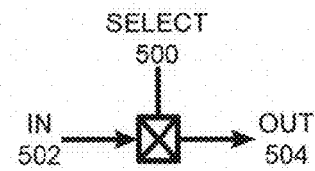
FIG. 5B illustrates a symbolic representation of a pass-gate in accordance with an embodiment of the present invention.

One common multiplexer implementation uses a parallel arrangement of NMOS and PMOS pass-gates (as shown in FIGS. 5A-5B, where FIG. 5A illustrates a complementary pass-gate circuit and FIG. 5B illustrates the symbolic representation of a pass-gate). When the select signal 500 for the multiplexer is set to HI, the pass-gate passes a signal from in port 502 to out port 504. The NMOS and PMOS transistors work together to allow both HI and LO signals to be passed, with the NMOS transistor pulling down the voltage at out port 504 when a low voltage is present at in port 502 and the PMOS transistor pulling up the voltage at out port 504 when a high voltage is present at in port 502.

Figure 5C:
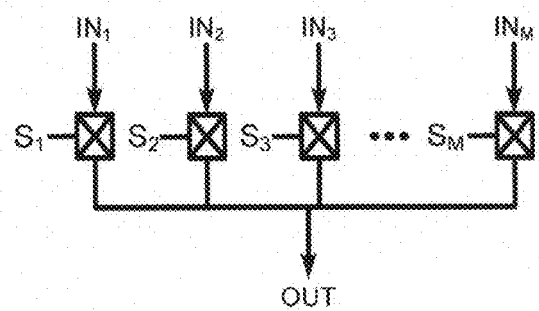
FIG. 5C illustrates an implementation of an M:1 multiplexer that uses complementary pass-gates in accordance with an embodiment of the present invention.

FIG. 5C illustrates an implementation of an M:1 multiplexer that uses complementary pass-gates. Asserting one of the select signals $\{S_1, S_2, S_3, \ldots, S_M\}$ passes the corresponding input signal to the output port. Note that the illustrated multiplexer design includes several limitations, the most notable of which is density. An M:1 multiplexer typically requires 2M transistors, assuming that a complementary select signal is already available. Because PMOS transistors are substantially slower than NMOS transistors, their widths need to be larger in order to compensate for their higher resistances. For example, in a 180 nm semiconductor process, the carrier mobility for PMOS devices is roughly three times that of NMOS devices; hence, the total size of a complementary PMOS pass-gate is roughly equivalent to that of four NMOS transistors.

Note that the PMOS transistor in a complementary pass-gate is used only to pass HI signals. A typical NMOS transistor cannot be used in place of the PMOS transistor, because an NMOS transistor will saturate when its source voltage reaches one threshold voltage ($V_{TH}$) below the gate voltage, effectively limiting the voltage passed across the source and the drain of the NMOS transistor to $V_{DD}-V_{TH}$ for a gate driven by a voltage of $V_{DD}$.

Many modern fabrication processes include thick-oxide NMOS transistors that can operate at voltages substantially higher than nominal supply voltages. These thick-oxide NMOS transistors have thicker layers of gate oxide that prevent gate breakdown when high voltages are applied. For example, a 1.8V 180 nm process may offer thick-oxide NMOS transistors for 3.3V operation, and a 1.0V 90 nm process may offer thick-oxide NMOS transistors for operation at 1.8V, 2.5V, and 3.3V.

One embodiment of the present invention reduces the power used by multiplexer pass-gates by replacing a PMOS transistor with a thick-oxide, high-threshold NMOS transistor. Because voltages higher than nominal $V_{DD}$ can be applied to the gate of such a thick-oxide NMOS transistor, such transistors can be used to pass a full range of nominal signal voltages.

Figure 6:
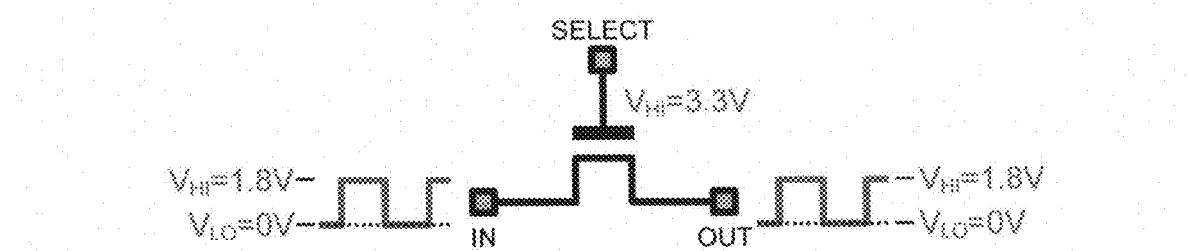
FIG. 6 illustrates an exemplary thick-oxide NMOS transistor in accordance with an embodiment of the present invention.

FIG. 6 illustrates an exemplary thick-oxide NMOS transistor in a 1.8V process that is driven at 3.3V. The threshold voltage of this transistor is around 0.7V (as compared to the threshold voltage of a typical NMOS device, which is roughly 0.45V in a 1.8V process). When a HI (3.3V) voltage is applied to the gate of the transistor, the source voltage can rise to 2.6V (e.g., 3.3V-0.7V) before the gate saturates. Because the maximum nominal signal voltage is 1.8V, the transistor can pass a full range of signal voltages without saturating. Hence, the described technique allows a single (thick-oxide) NMOS transistor to pass a full range of signal voltages, thereby eliminating the need for complementary pass-gates. Although the minimum size of a thick-oxide NMOS transistor is generally larger than that of a typical NMOS transistor, this technique can still result in savings in transistor area and power over complementary NMOS and PMOS transistors. For instance, for the previously described 4×4 macropad with micropads sized 7×7 µm and spaced 2 µm apart, the use of thick-oxide NMOS pass-gates over complementary pass-gets yields a power savings of about 21.1%.

Unfortunately, while thick-oxide NMOS transistors can be used to replace PMOS transistors, they also have several performance limitations. First, because the minimum length of a thick-oxide NMOS transistor is longer than that of a regular NMOS transistor, its resistivity is higher and its performance is generally inferior, thereby reducing area and power savings. Furthermore, the higher supply voltages needed by thick-oxide transistors often involve a separate supply voltage that needs to be distributed across the chip and/or voltage conversion circuitry that converts nominal signal levels to high-voltage levels.

Reducing Multiplexer Power Consumption Using Bootstrap Transistors

One embodiment of the present invention uses two standard NMOS transistors to pass a full range of signal voltages, with the first transistor serving as a "bootstrap transistor" for a second transistor, the "pass-gate transistor." The gate of the bootstrap transistor is tied to $V_{DD}$, the source of the bootstrap transistor is coupled to the select signal for the pass-gate, and the drain of the bootstrap transistor is connected to the gate of the pass-gate transistor. The source of the pass-gate transistor receives the input signal, while the drain of the pass-gate transistor serves as the output signal. During operation, the characteristics of the combined bootstrap transistor and pass-gate transistor facilitate passing both high-voltage and low-voltage signals across the pass-gate transistor.

Figure 7A:
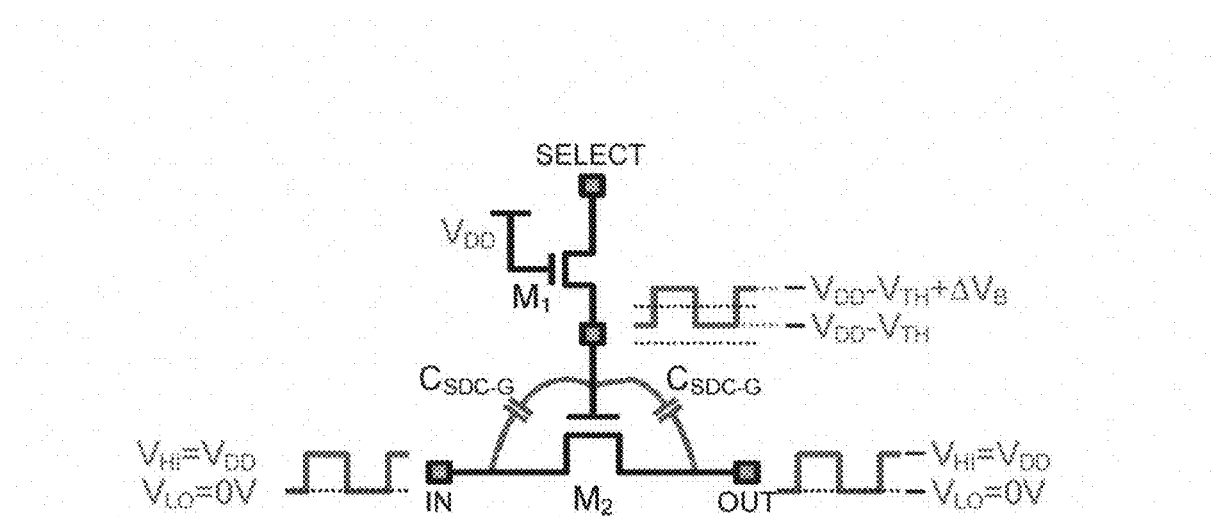
FIG. 7A illustrates a pass-gate that uses two standard NMOS transistors to pass a full range of signal voltages in accordance with an embodiment of the present invention.

FIG. 7A illustrates a pass-gate that uses two standard NMOS transistors to pass a full range of signal voltages, where $M_1$ is the bootstrap transistor and $M_2$ is the pass-gate transistor. Instead of being directly connected to the gate of the pass-gate transistor $M_2$, the select signal now passes through the bootstrap transistor ($M_1$), whose gate is tied to HI ($V_{DD}$). When the select signal is LO (0V), the gate of $M_2$ is pulled LO, turning off $M_2$ and disconnecting the output OUT from the input IN. When the select signal is HI, the voltage output to the gate of $M_2$ by $M_1$ is only ($V_{DD}-V_{TH}$), where $V_{TH}$ is the threshold voltage of $M_1$. Because $M_1$ is at the edge of subthreshold conduction, the gate of $M_2$ is only very weakly held. Hence, the gate of $M_2$ is semi-floating, or "bootstrapped." Note that when the input signal is LO (0V), this semi-floating voltage on the gate of $M_2$ is sufficient to pass the LO input signal to the output.

Note that coupling capacitances exist between the channel (e.g., the source and the drain) and the gate of transistor $M_2$ (indicated by the capacitances $C_{SDC-G}$ in FIG. 7A). When the input signal transitions from a LO (0V) to a HI ($V_{DD}$) voltage signal, the coupling between the channel and the gate ($C_{SDC-G}$) causes the gate of $M_2$ to rise an additional amount, $\Delta V_B$, where the value of $\Delta V_B$ depends upon the ratio of the capacitance at the gate of $M_2$ to the coupling capacitance $C_{SDC-G}$. The sizes of $M_1$ and $M_2$ can be sized such that $\Delta V_B$ is approximately 0.8 to 0.9 times the value of $V_{DD}$, so that the gate voltage of $M_2$ ($V_{DD}-V_{DD}+\Delta V_B$) is sufficiently above $V_{DD}$ (when the input is HI) to allow the NMOS transistor to pass $V_{DD}$ to the output without saturating.

Figure 7B:
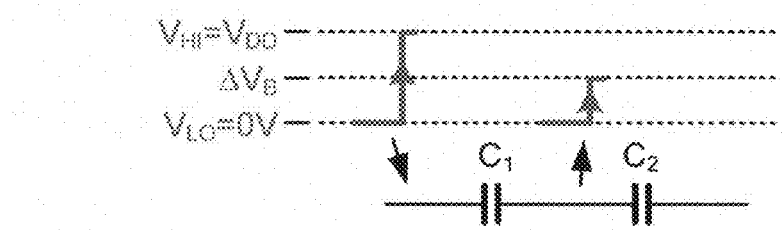
FIG. 7B illustrates the effect of a sudden voltage rise across two capacitors in series in accordance with an embodiment of the present invention.

Note that the boost of the gate voltage for $M_2$ is enabled by the weakly-held intermediate voltage output by the bootstrap transistor when the select is HI. The presence of this intermediate voltage facilitates the coupling between the input and gate of $M_2$, thereby allowing the gate voltage to move synchronously with the HI data input signal. Specifically, when this data input signal quickly changes to HI, charge coupled through the capacitance to the gate node cannot be immediately discharged, causing the gate voltage for $M_2$ to temporarily increase in potential. This effect is substantially similar to the effect seen for a sudden voltage rise across two capacitors placed in series (as illustrated in FIG. 7B, where the sudden voltage rise in the circuit to the left of $C_1$ causes a corresponding (but smaller in magnitude) voltage rise for $C_2$). Note that while this additional charge eventually is discharged (e.g., by dissipating across inherent resistance or other parasitic coupling to ground or other signals), the circuit can be fabricated such that the time constant for this dissipation is sufficiently longer (e.g., lower in frequency) than the time interval for which the signal is passed such that leakage does not interfere with the passage of the high voltage signal.

The described bootstrapping technique does not require complementary pass-gates or thick-oxide transistors that require a separate power supply. By using only standard NMOS transistors, the described circuit reduces the amount of power needed to pass signals. In addition, because the gate node of the pass-gate transistor is semi-floating, its effective channel-to-gate capacitance is negligible, provided that the bootstrap transistor is small. This property reduces the parasitic capacitance seen at the input node, which allows signal drivers to be sized significantly smaller and leads to additional power savings. For instance, for the previously described 4×4 macropad with micropads sized 7×7 µm and spaced 2 µm apart, the use of bootstrapped NMOS pass-gates over complementary pass-gates yields a power savings of about 21.5%.

Note that because the gate voltage of the pass-gate transistor changes correspondingly with the input signal, gate oxide breakdown is not an issue. Specifically, the gate voltage for $M_2$ is only above $V_{DD}$ when the channel voltage is also HI. Hence, the voltage difference between the gate and the channel is always less than $V_{DD}$.

Figure 8:
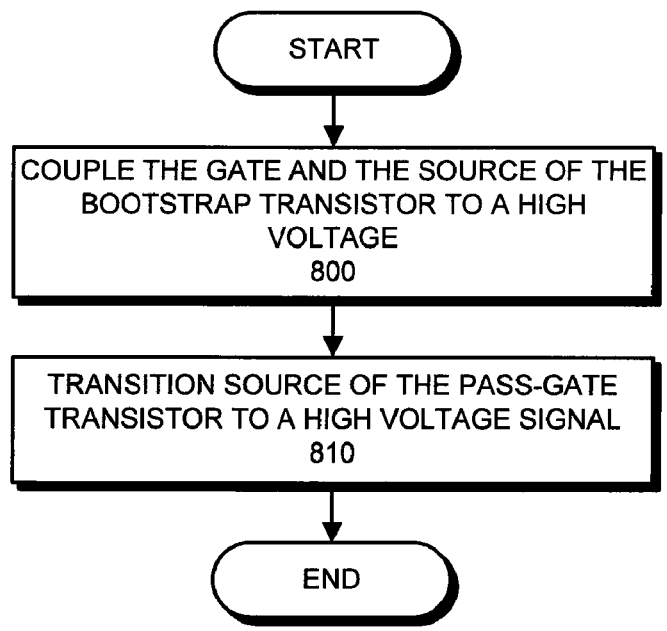
FIG. 8 presents a flowchart illustrating a process that facilitates proximity communication by allowing a high voltage signal to be passed across two standard NMOS gates in accordance with an embodiment of the present invention.

FIG. 8 presents a flowchart illustrating a process that facilitates proximity communication by allowing a high voltage signal to be passed across two standard NMOS gates. This process occurs for a computing device that includes a circuit with a bootstrap transistor and a pass-gate transistor, where: the drain of the bootstrap transistor is coupled to the gate of the pass-gate transistor; a first coupling capacitance exists between the source of the pass-gate transistor and the drain of the bootstrap transistor; and a second coupling capacitance exists between the drain of the pass-gate transistor and the drain of the bootstrap transistor. During operation, the gate and the source of the bootstrap transistor is coupled to a high voltage. Subsequently, the source of the pass-gate transistor is transitioned to a high voltage signal. This transition, in combination with the two coupling capacitances and a floating voltage generated by the bootstrap transistor, boosts the voltage at the gate of the pass-gate transistor higher than the high voltage signal, thereby enabling the high voltage signal to pass from the source to the drain of the pass-gate transistor.

In summary, bootstrapped NMOS pass-gates can be used to create an intermediate voltage that can be boosted above $V_{DD}$ in the presence of a high signal voltage, thereby allowing $V_{DD}$ to be passed through a pass-gate transistor without requiring a separate (higher) supply voltage and/or complex voltage conversion circuitry.

Using Floating Fill Metal to Lower Pad Capacitance

Most integrated circuit (IC) foundries stipulate minimum metal density rules which require that a minimum percentage, typically about 30%, of each metal layer in an IC be filled. These rules prevent the over-etching and pinching of isolated wires (also known as "microloading") due to prolonged etching times that are required to etch away metal in areas of low density. Typically, such minimum metal density rules are enforced over a window of a specified size, and therefore large cell blocks need to maintain minimum metal density by adding dummy metal structures (referred to as "fill" or "filler cells") in empty areas. Often such fill metal is tied to $V_{DD}$ or ground to facilitate power distribution across a semiconductor chip.

Unfortunately, fill metal in power grids can significantly increase the parasitic capacitances of wires in a circuit. In proximity communication circuits, the proximity input/output (I/O) pads are often drawn in the top-level metal layer, and fill metal is usually added in all metal layers below to meet minimum density rules. This organization can greatly increase the capacitance of proximity I/O pads, whose surface area is large in comparison to their thickness, because the pad capacitance is dominated by capacitance to signal or fill metal in lower metal layers. Overcoming this additional pad capacitance often requires increasing the size of signal drivers to drive larger pad loads, which requires higher transmit power.

Figure 9A:
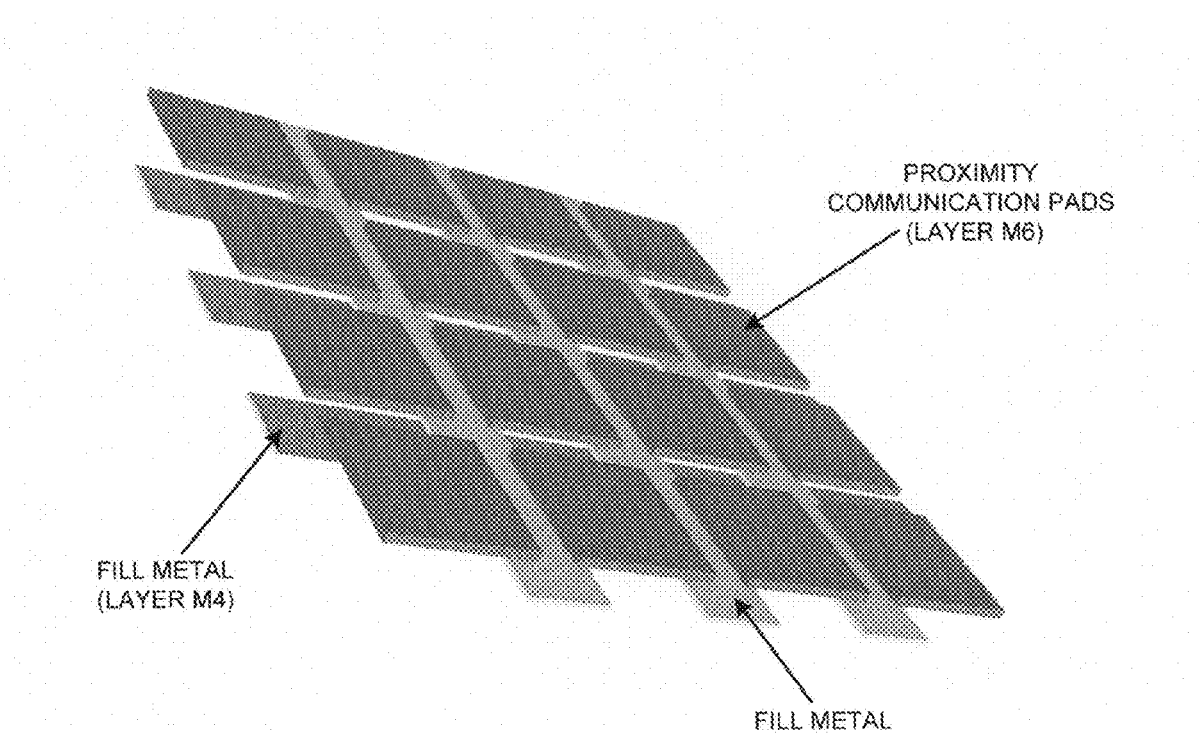
FIG. 9A illustrates lowering the capacitive loading of proximity communication pads by placing floating fill metal directly below gaps between the proximity communication pads in accordance with an embodiment of the present invention.

One embodiment of the present invention lowers the capacitive loading of proximity I/O pads by placing floating fill metal directly below gaps between the proximity I/O pads (as shown in FIG. 9A). Placing fill metal between gaps reduces the coupling area between the pads and the fill metal. Furthermore, allowing the fill metal to float (e.g., by not connecting the fill metal to any voltage) further reduces the pad capacitance to the point where the remaining pad capacitance is primarily the coupling capacitance with the fill metal in series with the coupling capacitance between the fill metal and all other surrounding metal.

Figure 9B:
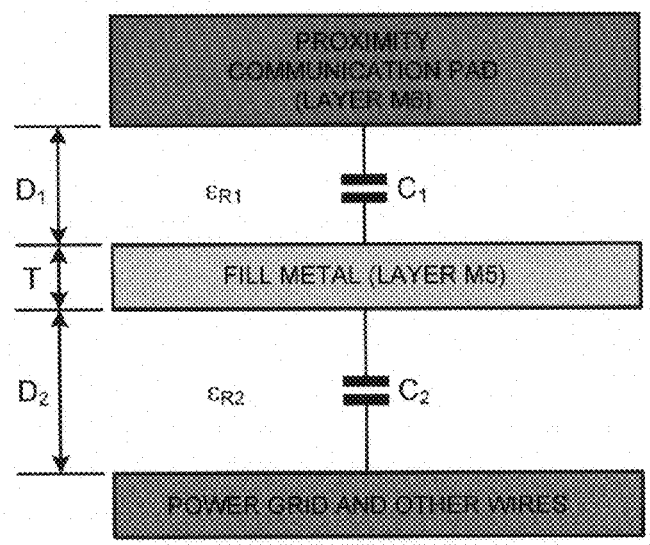
FIG. 9B illustrates the capacitance seen by a proximity communication pad in accordance with an embodiment of the present invention.

FIG. 9B illustrates the capacitance seen by a proximity I/O pad. For the illustrated metal structure, when the fill metal in layer M5 is tied to a fixed voltage, the pad capacitance is approximately:

$$C_1 = \frac{\varepsilon_{R1}\varepsilon_0 A}{D_1},$$

where A is the coupling area, $\varepsilon_{R1}$ is the dielectric constant of the material between layers M5 and M6, $\varepsilon_0$ is the permittivity of free space, and $D_1$ is the distance between layers M5 and M6, and assuming negligible coupling to adjacent pads. If the fill metal is floating, however, the pad capacitance effectively becomes the series combination of $C_1$ and $C_2$, where $C_2$ represents the coupling capacitance between the fill metal and all other surrounding wires. This series capacitance is given by $$C_{pad} = \frac{\varepsilon_{R1}\varepsilon_{R2}\varepsilon_0 A}{\varepsilon_{R1}D_2 + \varepsilon_{R2}D_1},$$

which, for the case where $\varepsilon_{R2}=\varepsilon_{R1}=\varepsilon_R$, reduces to $$C_{pad} = \frac{\varepsilon_R\varepsilon_0 A}{D_1 + D_2},$$

which is lower than $C_1$.

In an exemplary 0.18 μm 1P6M process (which includes six metal layers), $D_1$=0.8 μm and $D_2$=1.33 μm (to metal layer M4), assuming a ground plane in layer M4. In this scenario, about 65% of the pad capacitance is capacitance to metal layer M5, and the described technique can reduce the pad capacitance by up to 41.6%.

In one embodiment of the present invention, floating fill metal is partitioned into multiple smaller pieces, so that each piece of fill metal does not straddle areas below two adjacent micropads. Partitioning the fill metal prevents coupling of a differing signal at the boundaries of different logical macropads, thereby eliminating increased capacitances due to the Miller effect.

Figure 9C:
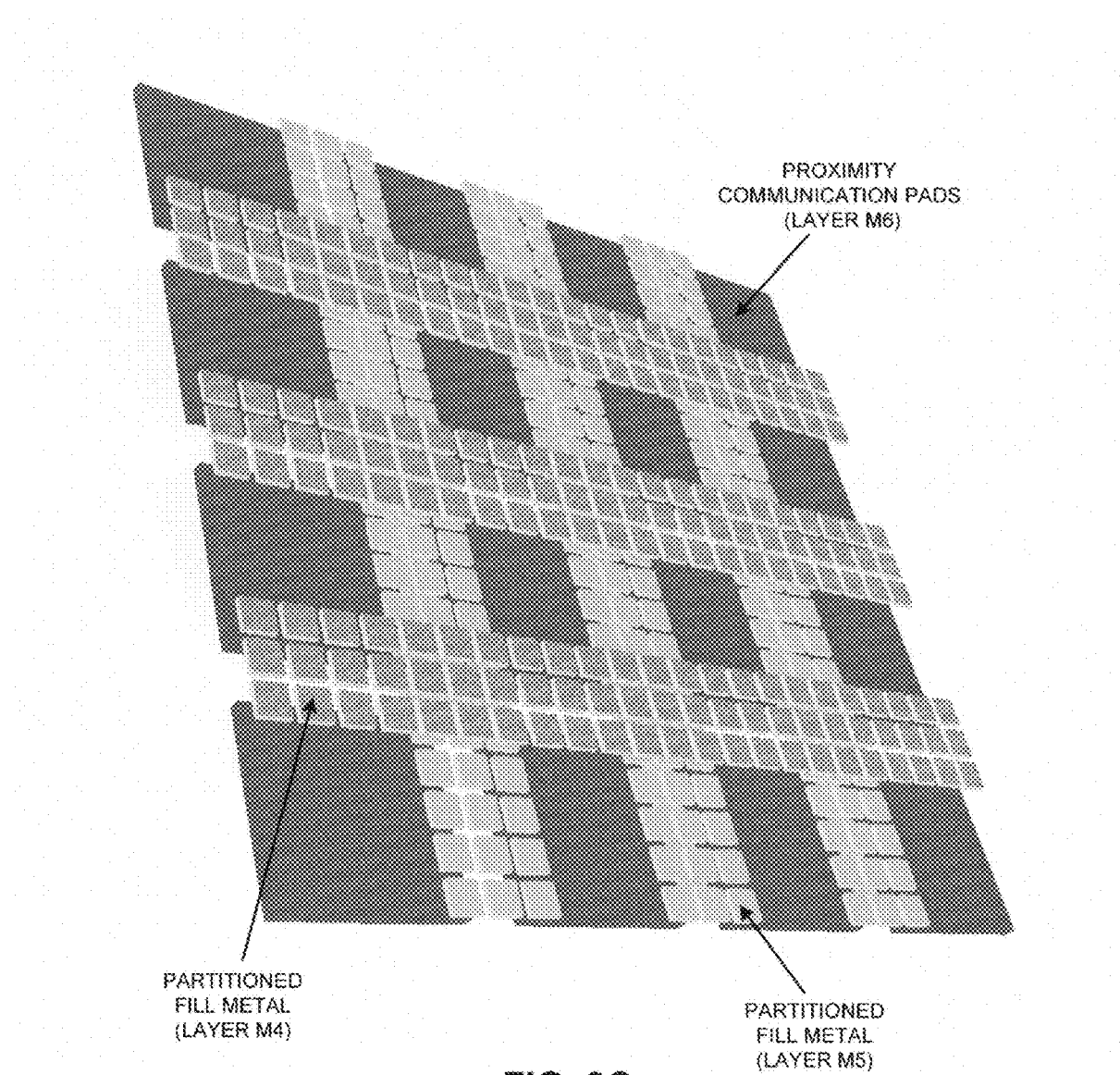
FIG. 9C illustrates a back-side view of a 4×4 macropad cell with partitioned floating metal layers in accordance with an embodiment of the present invention.

FIG. 9C illustrates a back-side view of a 4×4 macropad cell with partitioned floating M5 and M4 layers.

Routing Signals Over Areas with Probabilistically Favorable Coupling

Different micropads in a given (physical) transmit macropad cell typically have different probabilities of being driven to different signals. For the macropad cell illustrated in FIG. 2E, each micropad can be connected to a data signal from one of three sources: the north bit (me: N), the south bit (me: S), or a data signal from a neighboring macropad cell (fromW or fromE, each of which may also have two sources). By considering all of the possible horizontal and vertical shifts, one can calculate the probability with which each micropad will be steered to each of the three data sources.

FIG. 10A illustrates the computed routing probabilities for the 4×4 micropad array structure illustrated in FIG. 2E, assuming that the selection probability of each of the 25 possible shifts (illustrated in FIG. 3) is equal.

FIG. 10B illustrates the computed routing probabilities for the more power-optimal micropad array illustrated in FIG. 4A, where some of the data signals in the top row and the third column are hard-wired. The values in FIG. 10B illustrate how certain rows and columns of the micropad cells (from FIG. 4A) are much more likely to be steered toward one of the three data sources. For example, the column 3 micropads have average probabilities of 62.5% and 37.5% of being steered to the north (N) and south (S) bits, respectively. On the other hand, the column 1 micropads has average probabilities of 31.25% and 18.75% of being steered to the north (N) and south (S) bits, respectively. Therefore, the third column has twice the probability of being driven to the north or south bits (N or S), compared to the first column.

One embodiment of the present invention routes data wires over areas with probabilistically favorable coupling to exploit the distribution of steering probabilities, thereby lowering power consumption. For example, because the third column of micropads in FIG. 10B has a much higher probability of being driven to the north bit (N) compared to other columns, the data wire for this (N) data signal can be routed over this column. When the third column is selected to be driven to the north bit (N), all of the wires in the micropad cell toggle in the same way, which significantly reduces the effective capacitance of the data wire under the column. For symmetry, the data wire for the south bit (S) can be routed over the second column, which has the second-highest probability (28.125%, on average) of being driven to this (S) data signal.

Note that this technique saves power without requiring any additional circuit complexity, separate supply voltages, or circuit components. For the case of the 4×4 micropad array illustrated in FIG. 4A, this technique can provide a savings of up to 62.5% of the wire energy for the north data wire, and 18.7% for the south data wire. Note that the savings are significantly less for the south data wire because the first row is hard-wired to the north data wire, which skews the probability distribution favorably toward the north bit.

Checkerboard Micropad Arrays

One embodiment of the present invention uses checkerboard micropad arrays to reduce transmit power. A checkerboard micropad array structure uses half the number of micropads and half the number of second-level multiplexers, and can therefore offer significant power savings. However, a checkerboard micropad array also provides less coupling capacitance for signal transmission, and hence typically involves careful consideration of the tradeoff between coupling degradation and power reduction. A net benefit can be realized when the potential power savings is greater than the reduction in coupling capacitance.

Figure 11:
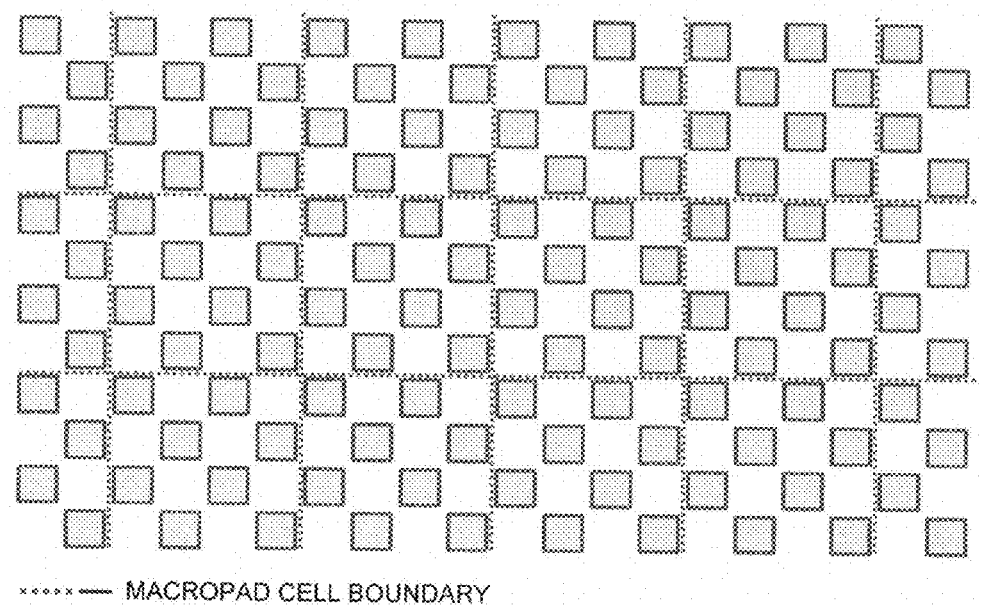
FIG. 11 illustrates a checkerboard micropad array in accordance with an embodiment of the present invention.

FIG. 11 illustrates a checkerboard micropad array. The illustrated checkerboard micropad array uses half the number of micropads of a fully-populated micropad array (illustrated in FIG. 1B), instead containing a micropad only at every other location, both horizontally and vertically.

Figure 12:
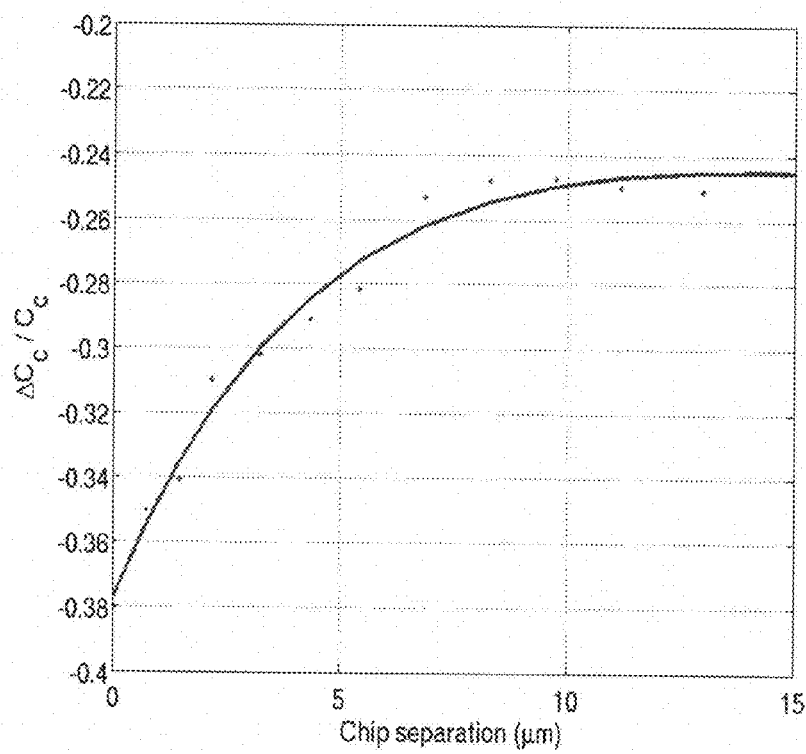
FIG. 12 illustrates how the coupling capacitance of a checkerboard array compares to that of a fully-populated micropad array for a range of chip separation distances in accordance with an embodiment of the present invention.
Figure 13A:
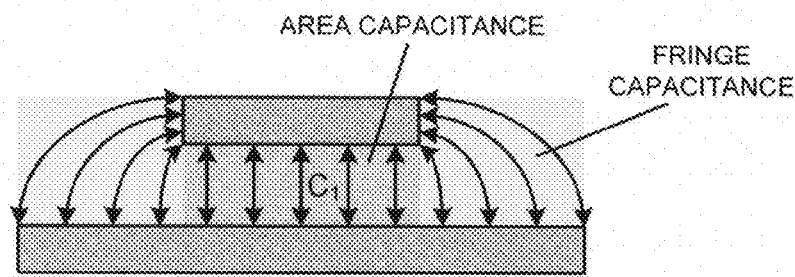
FIG. 13A illustrates area and fringe capacitance in accordance with an embodiment of the present invention.
Figure 13B:
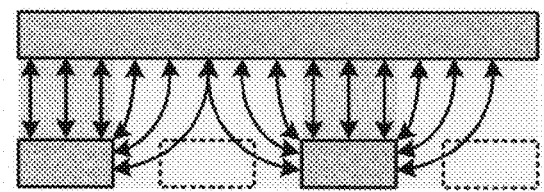
FIG. 13B illustrates the presence of fringe capacitance for areas in a checkerboard array that would otherwise have been occupied by micropads (in a fully-populated transmit array) in accordance with an embodiment of the present invention.

FIG. 12 illustrates how the coupling capacitance, Cc, of a checkerboard array compares to that of a fully-populated micropad array for a range of chip separation distances. These results are obtained from three-dimensional field-solver simulations of a 4×4 array of micropads sized 7×7 μm and spaced 2 μm apart. Note that the reduction in coupling capacitance is less than 50%, even though the checkerboard array includes only half of the standard number of micropads. This fractional reduction occurs because coupling capacitance includes both area coupling and fringe coupling. As illustrated in FIG. 13A, area capacitance (and area coupling) is generally proportional to the coupling area, while fringe capacitance (and fringe coupling) mostly occurs along the perimeter of the pad. For a fully-populated micropad array, the coupling capacitance is dominated by area coupling, because almost the entire receiving pad area is exposed to transmit micropads, and the sides of the micropads couple mostly to adjacent micropads. With a checkerboard array, while area coupling reduces significantly, this reduction is somewhat mitigated by fringe coupling along the sides of the micropads, where adjacent micropads are now absent (as illustrated in FIG. 13B).

Note that the relative reduction in coupling capacitance is lower at larger chip separations. This is due to the fact that fringe coupling decreases with distance Z as $\sim\log(1+t/Z)$ (where t is thickness of the metal), while area coupling decreases much more quickly with distance as $(\sim 1/Z)$. The lower relative reduction of coupling capacitance at large chip separations therefore confirms the existence of a large fringe component in the coupling capacitance for the checkerboard layout.

Figure 13C:
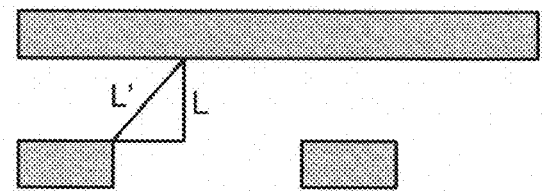
FIG. 13C illustrates fringe and area coupling effects for two proximity communication pads in close proximity in accordance with an embodiment of the present invention.
Figure 13D:
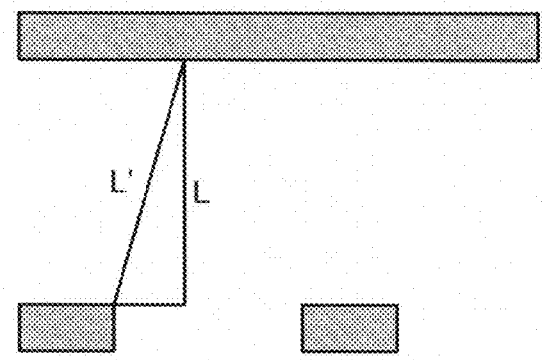
FIG. 13D illustrates fringe and area coupling effects for two proximity communication pads as the distance between the two proximity communication pads increases in accordance with an embodiment of the present invention.

FIGS. 13C-13D illustrate the effect on the relative distance over which coupling occurs when the distance between two proximity communication pads is increased. In FIG. 13C, the two pads are close together, and the coupling distance (L') for fringe coupling is considerably larger than the coupling distance (L) for area coupling, resulting in larger overall reduction coupling capacitance (when removing micropads). As the distance between the two pads is increased, however (see FIG. 13D), L' approaches L, and the coupling due to fringe capacitance approaches the area coupling, thereby decreasing the reduction in coupling capacitance (due to removed micropads).

In comparison with a fully-populated micropad array, the above-described checkerboard micropad array uses only half the number of micropads and half the number of second-level multiplexers. For an N×N array, this technique saves $N^2/2$ micropads and $N^2/2$ second-level multiplexers. Hence, the savings in power and circuit complexity is much higher for large values of N. For N=4, the savings in power is approximately 40.4%. While this is comparable to the reduction in coupling capacitance at zero chip separation, in practical applications chip separations range between 3 to 10 μm. In this regime, the reduction in coupling capacitance is about 25 to 30% compared to a fully-populated micropad array; the savings in power therefore outweighs the reduction in coupling capacitance.

Figure 14:
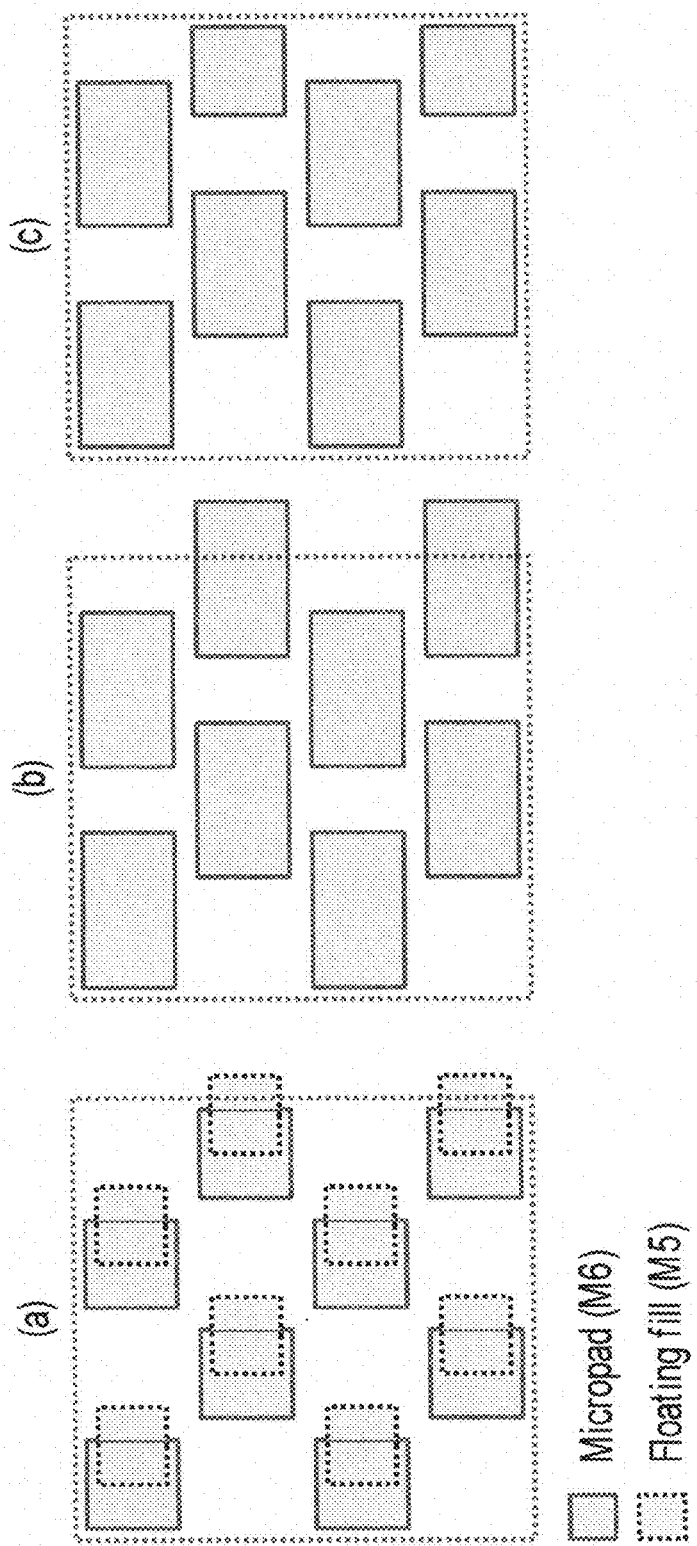
FIG. 14 illustrates three alternative arrangements for checkerboard micropad arrays in accordance with an embodiment of the present invention.

FIG. 14 illustrates three alternative arrangements for checkerboard micropad arrays. Arrangement (a) illustrates a checkerboard micropad array that includes floating fill metal below each micropad. This floating fill may be offset in position from the micropad in one of the two dimensions (as shown), or both dimensions (not shown). In this arrangement, a signal driven onto a micropad couples to the fill metal, which in turn couples to the receiving pad on the receiving chip, thereby enhancing signal coupling. Arrangement (b) illustrates a checkerboard micropad array with elongated micropads. This arrangement also enhances signal coupling; although the capacitance of each micropad is higher, the reduced micropad count still provides an $N^2/2$ reduction in the number of second-level multiplexers.

Note that in both arrangements (a) and (b) of FIG. 14 the floating fill and/or elongated pad extensions may couple the signal onto an adjacent receiving pad, which can introduce crosstalk noise. Arrangement (c) in FIG. 14 illustrates a checkerboard micropad array where some micropads do not have extensions. This arrangement mitigates the introduction of crosstalk when steering is at the nominal horizontal configuration.

In summary, embodiments of the present invention reduce the power consumed for electronic alignment correction in proximity communication circuits by:

hard-wiring columns and/or rows of micropads in the steering fabric;

using thick-oxide NMOS transistor pass-gates in the steering fabric;

using bootstrapped NMOS transistor pass-gates in the steering fabric;

using floating fill-metal to reduce parasitic pad capacitance;
routing signals over areas with probabilistically favorable coupling; and/or
using a checkerboard micropad array.

The described techniques facilitate increasing the voltage swing across a transmit pad for a given amount of power, thereby improving the signal detected by a receiving circuit and improving the efficiency and range of proximity communication.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A circuit that facilitates proximity communication, comprising:
   a bootstrap transistor; and
   a pass-gate transistor;
   wherein the gate and the source of the bootstrap transistor are coupled to a high voltage;
   wherein the drain of the bootstrap transistor is coupled to the gate of the pass-gate transistor;
   wherein a first coupling capacitance exists between the source of the pass-gate transistor and the drain of the bootstrap transistor and a second coupling capacitance exists between the drain of the pass-gate transistor and the drain of the bootstrap transistor;
   wherein transitioning to a high voltage at the source of the pass-gate transistor causes the first coupling capacitance and the second coupling capacitance to boost the voltage at the gate of the pass-gate transistor higher than the high voltage, thereby enabling the high voltage at the source of the pass-gate transistor to pass to the drain of the pass-gate transistor.

2. The circuit of claim 1, wherein the bootstrap transistor and the pass-gate transistor are NMOS transistors.

3. The circuit of claim 2,
   wherein the source of the bootstrap transistor is a select signal for the circuit;
   wherein when the select signal is coupled to the high voltage, the boosted high voltage at the source of the pass-gate transistor passes the high voltage at the source of the pass-gate transistor to the drain of the pass-gate transistor; and
   wherein when the select signal is coupled to the high voltage, a low voltage at the source of the pass-gate transistor causes a low voltage at the drain of the pass-gate transistor.

4. The circuit of claim 3, wherein the circuit is used for a pass-gate that facilitates electronic alignment correction by passing an input signal using reduced power and/or area.

5. The circuit of claim 4,
   wherein the circuit facilitates increasing the voltage swing across the pass-gate transistor for a given amount of power;
   wherein the circuit passes the high voltage to a transmission pad in a proximity communication circuit that sends a signal to a receiving circuit using proximity communication; and
   wherein maximizing the voltage swing across the transmission pad improves the signal detected by the receiving circuit while reducing the power used by the proximity communication circuit.

6. The circuit of claim 1, wherein the bootstrap transistor and the pass-gate transistor are fabricated to provide a desired voltage boost for the gate of the pass-gate transistor.

7. The method of claim 6, wherein fabricating the bootstrap transistor and the pass-gate transistor involves:
   sizing the bootstrap transistor and the pass-gate transistor to provide the desired voltage boost; and
   adjusting characteristics for the pass-gate transistor to produce capacitances for the first coupling capacitance and the second capacitance that enable the transition to the high voltage to boost the voltage at the gate of the pass-gate transistor higher than the high voltage.

8. The circuit of claim 1,
   wherein the bootstrap transistor facilitates boosting the voltage for the gate of the pass-gate transistor above the high voltage, thereby enabling the high voltage to be passed across the pass-gate transistor; and
   wherein the high voltage is passed across the pass-gate transistor without requiring a second voltage supply that generates a voltage higher than the high voltage.

9. The circuit of claim 1,
   wherein the high voltage at the gate and source of the bootstrap transistor causes an intermediate voltage at the drain of the bootstrap transistor;
   wherein the intermediate voltage at the drain of the bootstrap transistor reduces the coupling capacitance seen at the source of the pass-gate transistor; and
   wherein reduced parasitic capacitance at the source of the pass-gate transistor facilitates using smaller signal drivers for the input of the pass-gate transistor, thereby enhancing power savings.

10. A computing device, comprising:
    a transmitting component that includes a transmission pad that is used for proximity communication; and
    a receiving component that includes a receiving pad that is used for proximity communication;
    wherein the transmitting component includes a circuit for facilitating proximity communication that includes:
    a bootstrap transistor; and
    a pass-gate transistor;
    wherein the gate and the source of the bootstrap transistor are coupled to a high voltage;
    wherein the drain of the bootstrap transistor is coupled to the gate of the pass-gate transistor;
    wherein a first coupling capacitance exists between the source of the pass-gate transistor and the drain of the bootstrap transistor and a second coupling capacitance exists between the drain of the pass-gate transistor and the drain of the bootstrap transistor; and
    wherein transitioning to a high voltage at the source of the pass-gate transistor causes the first coupling capacitance and the second coupling capacitance to boost the voltage at the gate of the pass-gate transistor higher than the high voltage, thereby enabling the high voltage at the source of the pass-gate transistor to pass to the drain of the pass-gate transistor.

11. The computing device of claim 10, wherein the bootstrap transistor and the pass-gate transistor are NMOS transistors.

12. The computing device of claim 11,
    wherein the source of the bootstrap transistor is a select signal for the circuit;
    wherein when the select signal is coupled to the high voltage, the boosted high voltage at the source of the pass-gate transistor passes the high voltage at the source of the pass-gate transistor to the drain of the pass-gate transistor; and wherein when the select signal is coupled to the high voltage, a low voltage at the source of the pass-gate transistor causes a low voltage at the drain of the pass-gate transistor.

13. The computing device of claim 12, wherein the circuit is used for a pass-gate that facilitates electronic alignment correction by passing an input signal using reduced power and/or area.

14. The computing device of claim 13, wherein the circuit facilitates increasing the voltage swing across the pass-gate transistor for a given amount of power;

wherein the circuit passes the high voltage to a transmission pad in a proximity communication circuit that sends a signal to a receiving circuit using proximity communication; and wherein maximizing the voltage swing across the transmission pad improves the signal detected at the receiving pad while reducing the power used by the proximity communication circuit.

15. The computing device of claim 10, wherein the bootstrap transistor and the pass-gate transistor are fabricated to provide a desired voltage boost for the gate of the pass-gate transistor.

16. The computing device of claim 15, wherein fabricating the bootstrap transistor and the pass-gate transistor involves:

sizing the bootstrap transistor and the pass-gate transistor to provide the desired voltage boost; and adjusting characteristics for the pass-gate transistor to produce capacitances for the first coupling capacitance and the second capacitance that enable the transition to the high voltage to boost the voltage at the gate of the pass-gate transistor higher than the high voltage.

17. The computing device of claim 10, wherein the bootstrap transistor facilitates boosting the voltage for the gate of the pass-gate transistor above the high voltage, thereby enabling the high voltage to be passed across the pass-gate transistor; and wherein the high voltage is passed across the pass-gate transistor without requiring a second voltage supply that generates a voltage higher than the high voltage.

18. The computing device of claim 10, wherein the high voltage at the gate and source of the bootstrap transistor causes an intermediate voltage at the drain of the bootstrap transistor;

wherein the intermediate voltage at the drain of the bootstrap transistor reduces the coupling capacitance seen at the source of the pass-gate transistor; and wherein reduced coupling capacitance at the source of the pass-gate transistor facilitates using smaller signal drivers for the input of the pass-gate transistor, thereby enhancing power savings.

19. A method for facilitating proximity communication, where a computing device includes a circuit with a bootstrap transistor and a pass-gate transistor, where the drain of the bootstrap transistor is coupled to the gate of the pass-gate transistor, and where a first coupling capacitance exists between the source of the pass-gate transistor and the drain of the bootstrap transistor and a second coupling capacitance exists between the drain of the pass-gate transistor and the drain of the bootstrap transistor, comprising:

coupling the gate and the source of the bootstrap transistor to a high voltage; and transitioning the source of the pass-gate transistor to a high voltage;

wherein transitioning to a high voltage at the source of the pass-gate transistor causes the first coupling capacitance and the second coupling capacitance to boost the voltage at the gate of the pass-gate transistor higher than the high voltage, thereby enabling the high voltage at the source of the pass-gate transistor to pass to the drain of the pass-gate transistor.

20. The method of claim 19, wherein the bootstrap transistor and the pass-gate transistor are NMOS transistors.

* * * * *